(12) United States Patent
Yoshimura et al.

(10) Patent No.: US 9,453,881 B2
(45) Date of Patent: Sep. 27, 2016

(54) OSCILLATION CIRCUIT, INTEGRATED CIRCUIT, AND ABNORMALITY DETECTION METHOD

(71) Applicant: LAPIS Semiconductor Co., Ltd., Tokyo (JP)

(72) Inventors: Katsutoshi Yoshimura, Tokyo (JP); Kazutoshi Inoue, Tokyo (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 35 days.

(21) Appl. No.: 13/772,670

(22) Filed: Feb. 21, 2013

(65) Prior Publication Data
US 2013/0222068 A1    Aug. 29, 2013

(30) Foreign Application Priority Data

Feb. 24, 2012  (JP) ................................. 2012-039270

(51) Int. Cl.
| G01R 23/00 | (2006.01) |
| G01R 31/317 | (2006.01) |
| G01R 23/15 | (2006.01) |
| G01R 23/02 | (2006.01) |

(52) U.S. Cl.
CPC ......... G01R 31/31727 (2013.01); *G01R 23/00* (2013.01); *G01R 23/005* (2013.01); *G01R 23/02* (2013.01); *G01R 23/15* (2013.01)

(58) Field of Classification Search
CPC .... G01R 23/00; G01R 23/005; G01R 23/15; G01R 23/02; G01R 31/31727

USPC .............. 324/76.48; 331/44, 55, 64; 702/78; 327/18, 20, 47, 48
See application file for complete search history.

(56) References Cited

U.S. PATENT DOCUMENTS

| 6,469,544 | B2 * | 10/2002 | Kimura ........................... 327/20 |
| 7,154,305 | B2 * | 12/2006 | Driediger et al. .............. 327/47 |
| 7,529,961 | B2 * | 5/2009 | Kondou ........................ 713/502 |
| 2007/0230647 | A1 * | 10/2007 | Pourbigharaz et al. ...... 375/371 |
| 2009/0096495 | A1 * | 4/2009 | Keigo ........................... 327/142 |
| 2011/0057735 | A1 * | 3/2011 | Honda ............................ 331/57 |
| 2011/0234287 | A1 * | 9/2011 | Murray ......................... 327/299 |

FOREIGN PATENT DOCUMENTS

| JP | H01-288914 | 11/1989 |
| JP | 6-083474 A | 3/1994 |
| JP | H07-235831 | 9/1995 |
| JP | 8-076877 A | 3/1996 |
| JP | H10-116213 | 5/1998 |

* cited by examiner

*Primary Examiner* — Richard Tan
(74) *Attorney, Agent, or Firm* — Rabin & Berdo, P.C.

(57) ABSTRACT

There is provided an oscillation circuit including: a main oscillation circuit that outputs a specific main clock to an internal circuit; a sub oscillation circuit that outputs a sub clock having a different frequency to the frequency of the main oscillation circuit; a first abnormality detection section that detects an abnormality according to a number of main clock cycles output from the main oscillation circuit within a predetermined period corresponding to sub clock outputs from the sub oscillation circuit; and a second abnormality detection section that detects an abnormality according to a frequency divided clock of the main clock output from the main oscillation circuit that has been frequency-divided and the sub clock output from the sub oscillation circuit.

7 Claims, 8 Drawing Sheets

FIG.8

| | COMPARATOR (38) | COMPARATOR (42) | OSCILLATION VERIFICATION CIRCUIT |
|---|---|---|---|
| MAIN OSCILLATION CIRCUIT ABNORMAL OSCILLATION | NG | NG | — |
| SUB OSCILLATION CIRCUIT ABNORMAL OSCILLATION | NG | NG | — |
| SUB OSCILLATION CIRCUIT OSCILLATION CESSATION | NG | — | — |
| MAIN OSCILLATION CIRCUIT OSCILLATION CESSATION | — | — | NG |

OSCILLATION CIRCUIT, INTEGRATED CIRCUIT, AND ABNORMALITY DETECTION METHOD

CROSS-REFERENCE TO RELATED APPLICATION

This application is based on and claims priority under 35 USC 119 from Japanese Patent Application No. 2012-039270 filed on Feb. 24, 2012, the disclosure of which is incorporated by reference herein.

BACKGROUND

1. Technical Field

The present invention relates to an oscillation circuit, an integrated circuit, and an abnormality detection method.

2. Related Art

Integrated circuits (IC) installed with an oscillation circuit are generally installed with a single oscillation circuit system and configured to operate by a clock generated in the oscillation circuit.

Such ICs installed with an oscillation circuit operate according to the clock generated in the oscillation circuit, however the IC fails to operate normally when oscillation of the oscillation circuit stops or the oscillation frequency becomes abnormal due to for example abnormalities in the IC, with the possibility of this causing fatal system problems.

Technology is therefore demanded for detecting abnormalities in the operation of oscillation circuits. For example installing a monitoring timer with a self-reset function, such as a watchdog timer (WDT) might be considered. However, in such cases if the clock of the WDT stops, the WDT is no longer able to perform self-reset.

Examples of other technology that detects abnormality in an oscillation circuit include for example technology disclosed in Japanese Patent Application Laid-Open (JP-A) No. 6-83474 and JP-A No. 8-76877. The technology disclosed in JP-A No. 6-83474 and JP-A No. 8-76877 employs an abnormality detection clock output from an abnormality detection sub oscillation circuit that performs abnormality detection on a main oscillation circuit outputting a clock for internal circuit operation.

However, in the technology of JP-A No. 6-83474 and JP-A No. 8-76877, there is the issue that abnormality detection cannot be performed in cases in which abnormality occurs in the main oscillation circuit when the sub oscillation circuit has stopped.

In an oscillation circuit provided with a main oscillation circuit and a sub oscillation circuit, the inventors of the present invention investigated providing a new sub oscillation circuit checking oscillation circuit for checking the sub oscillation circuit. However, new issues are encountered, namely that when a new oscillation circuit is provided to check the sub oscillation circuit, a small overall size cannot be achieved for the oscillation circuits, and it also becomes necessary to ascertain the operation state of the new oscillation circuit provided to check the sub oscillation circuit.

SUMMARY

The present invention is proposed in order to address the above issues, and is directed towards providing an oscillation circuit, an integrated circuit, and an abnormality detection method capable of detecting an abnormality even when a sub oscillation circuit has stopped, and capable of also achieving a reduction in size of the oscillation circuit itself.

A first aspect of the present invention provides an oscillation circuit including:

a main oscillation circuit that outputs a specific main clock to an internal circuit;

a sub oscillation circuit that outputs a sub clock having a different frequency to the frequency of the main oscillation circuit;

a first abnormality detection section that detects an abnormality according to a number of main clock cycles output from the main oscillation circuit within a predetermined period corresponding to sub clock outputs from the sub oscillation circuit; and a second abnormality detection section that detects an abnormality according to a frequency divided clock of the main clock output from the main oscillation circuit that has been frequency-divided and the sub clock output from the sub oscillation circuit.

A second aspect of the present invention provides an integrated circuit including:

the oscillation circuit of the first aspect having a function to detect abnormalities in itself; and an internal circuit that operates according to a main clock output from a main oscillation circuit provided to the oscillation circuit.

A third aspect of the present invention provides a method of detecting an abnormality in an oscillation circuit including a main oscillation circuit that outputs a specific main clock to an internal circuit and a sub oscillation circuit that outputs a sub clock having a different frequency to the frequency of the main oscillation circuit, the method including:

storing levels of a frequency-divided clock of the main clock output from the main oscillation circuit that has been divided at timings corresponding outputs of the sub clock from the sub oscillation circuit; and detecting as an abnormality a fact that the oscillation has ceased in the main oscillation circuit when the stored level of the frequency divided clock is at the same level a predetermined successive number of times.

A fourth aspect of the present invention provides a method of detecting an abnormality in an oscillation circuit including a main oscillation circuit that outputs a specific main clock to an internal circuit and a sub oscillation circuit that outputs a sub clock having a different frequency to the frequency of the main oscillation circuit, the method including:

acquiring a number of cycles of the main clock output from the main oscillation circuit within a predetermined period corresponding to outputs of the sub clock from the sub oscillation circuit;

comparing the acquired number of main clock cycles against an upper limit value pre-stored in a storage section, and detecting an abnormality when the number of cycles of the main clock exceeds the upper limit value; and comparing the acquired number of main clock cycles against a lower limit value pre-stored in a storage section and detecting an abnormality when the number of cycles of the main clock is smaller than the lower limit value.

The present invention exhibits the advantageous effects of being capable of detecting abnormality even when a sub oscillation circuit has stopped, and also being capable of achieving a reduction in size of the oscillation circuit itself.

BRIEF DESCRIPTION OF THE DRAWINGS

Exemplary embodiments of the present invention will be described in detail based on the following figures, wherein:

FIG. 8 is a table summarizing relationships between abnormalities in a main oscillation circuit and a sub oscillation circuit and detection of abnormality (NG) by a comparator 38, a comparator 42 and an oscillation verification circuit of the present exemplary embodiment.

DETAILED DESCRIPTION

Explanation follows regarding an integrated circuit and an oscillation circuit with a self-diagnostic function according to an exemplary embodiment, with reference to the drawings. The following explanation deals separately with two abnormal states of a main oscillation circuit 30 and a sub oscillation circuit 50: abnormal oscillation, and oscillation cessation. Note that in the present exemplary embodiment, abnormal oscillation refers to an abnormal state wherein, although oscillation has not stopped, the oscillation frequency is higher or lower than a specific frequency.

Figure 1:
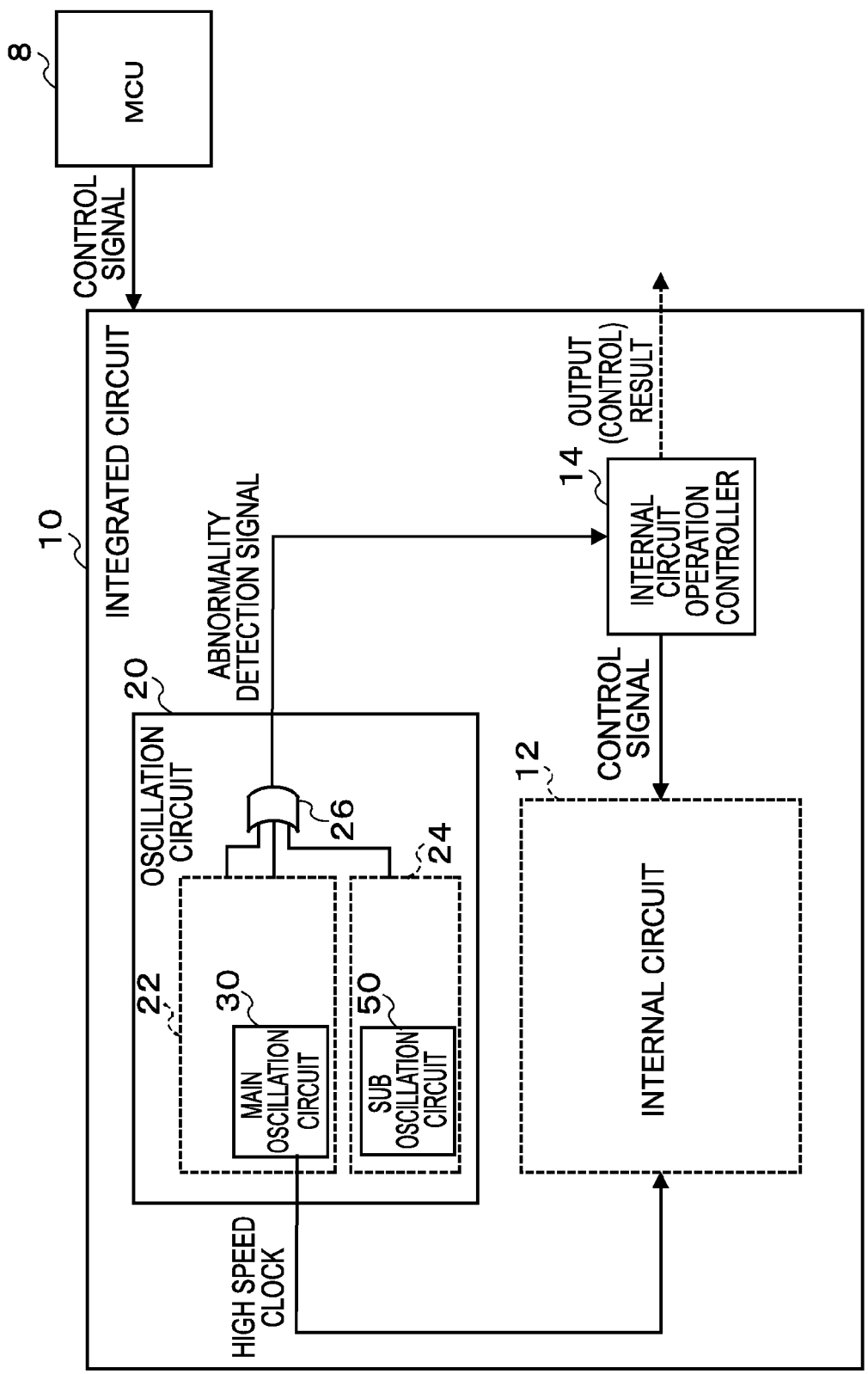
FIG. 1 is a schematic configuration diagram illustrating an example of a schematic configuration an integrated circuit of a present exemplary embodiment.

Firstly, explanation is given regarding a schematic configuration of an integrated circuit (IC) provided with an oscillation circuit of the present exemplary embodiment. FIG. 1 shows an example of a schematic configuration of an integrated circuit according to the present exemplary embodiment.

An integrated circuit 10 of the present exemplary embodiment is provided with an internal circuit 12, an internal circuit operation controller 14, and an oscillation circuit 20. Operation of the integrated circuit 10 is controlled based on control signals input from an external microprocessor (MCU) 8.

The oscillation circuit 20 is an oscillation circuit that includes an abnormality self-diagnostic function. More detailed explanation follows later, however the oscillation circuit 20 is provided with a first abnormality detection section 22 equipped with the main (high speed) oscillation circuit 30, a second abnormality detection section 24 equipped with the sub (low speed) oscillation circuit 50, and an OR circuit 26. An abnormality detection signal is output from the oscillation circuit 20 to the internal circuit operation controller 14. In the oscillation circuit 20 of the present exemplary embodiment, the detection of an abnormality is reported to the internal circuit operation controller 14 when an abnormality is detected in the main oscillation circuit 30 and/or the sub oscillation circuit 50.

A high speed clock is output from the main oscillation circuit 30 and supplied to the internal circuit 12. The internal circuit 12 performs a specific operation according to the high speed clock. Note that there are no particular limitations to the configuration and function of the internal circuit 12, provided that the internal circuit 12 performs a specific operation according to the high speed clock supplied from the main oscillation circuit 30.

The internal circuit operation controller 14 has a function of controlling operation of the internal circuit 12 and is for example configured from a control circuit and CPU. When the internal circuit operation controller 14 of the present exemplary embodiment receives an abnormality detection signal advising of the detection of an abnormality from the oscillation circuit 20, the internal circuit operation controller 14 performs specific control processing such as resetting the internal circuit 12 or stopping the function being performed in the internal circuit 12. The internal circuit operation controller 14 also reports that an abnormality has been detected (or reports that specific control processing has been performed) to an external section.

Figure 2:
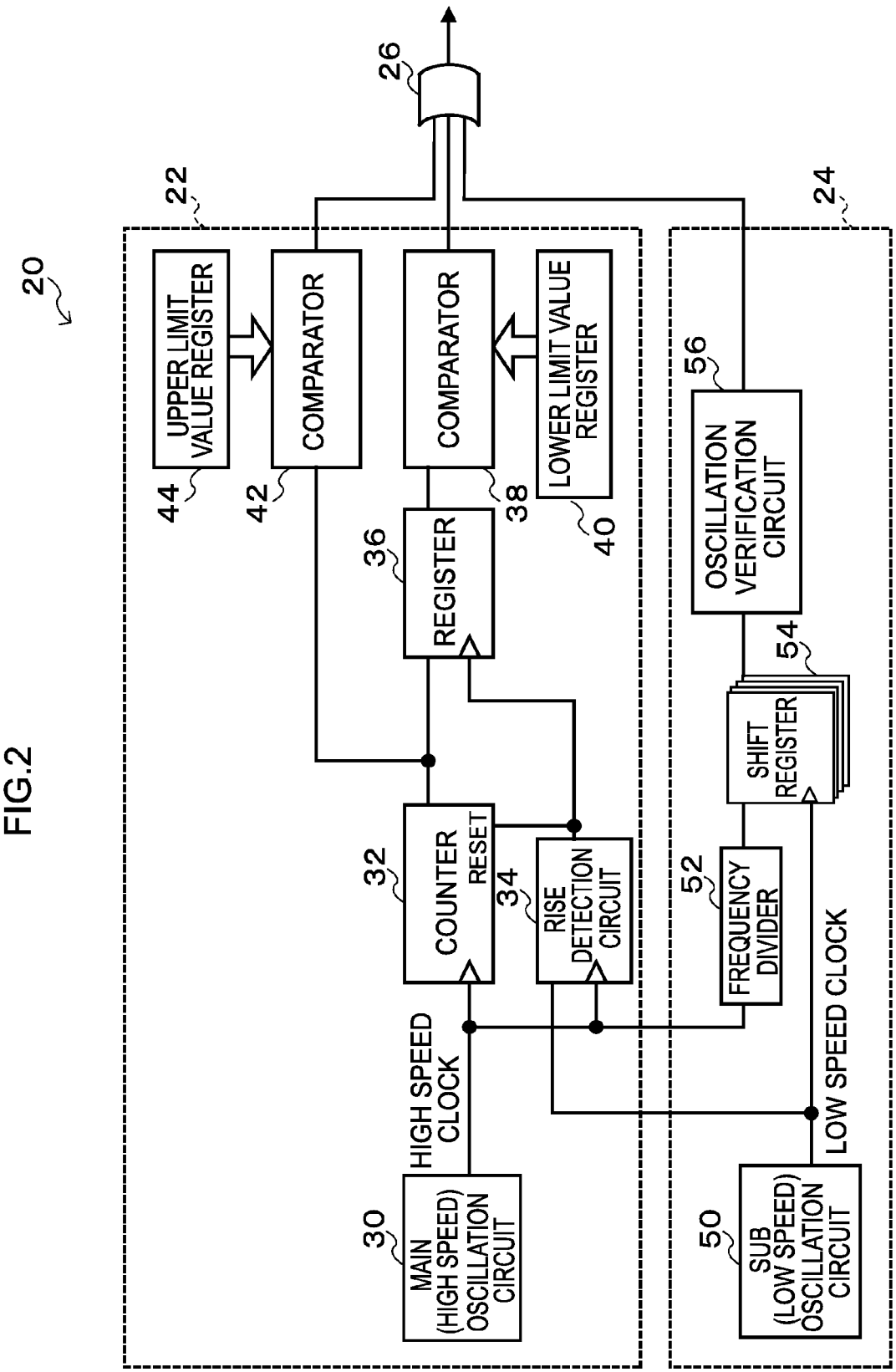
FIG. 2 is a schematic configuration diagram illustrating an example of a schematic configuration an oscillation circuit of the present exemplary embodiment.

Detailed explanation now follows regarding the oscillation circuit 20 with the self-diagnostic function of the present exemplary embodiment. FIG. 2 shows an example of a schematic configuration of the oscillation circuit 20 of the present exemplary embodiment. The oscillation circuit 20 of the present exemplary embodiment is, as described above, provided with the first abnormality detection section 22, the second abnormality detection section 24, and the OR circuit 26.

The first abnormality detection section 22 is equipped with the main oscillation circuit 30, a counter 32, a rise detection circuit 34, a register 36, a comparator 38, a lower limit value register 40, a comparator 42, and an upper limit value register 44. The second abnormality detection section 24 is equipped with the sub oscillation circuit 50, a frequency divider 52, a shift register 54 and an oscillation verification circuit 56.

The first abnormality detection section 22 detects as abnormalities both oscillation abnormalities in the main oscillation circuit 30 and/or the sub oscillation circuit 50, and oscillation cessation in the sub oscillation circuit 50. The second abnormality detection section 24 detects as an abnormality oscillation cessation in the main oscillation circuit 30.

The main oscillation circuit 30 is a high speed oscillation circuit (higher speed than the sub oscillation circuit 50) that generates a high speed clock supplied to the internal circuit 12. As a specific example, in the present exemplary embodiment, the oscillation frequency is set at 1 MHz. The sub oscillation circuit 50 is a low speed oscillation circuit (lower speed than the main oscillation circuit 30) that generates a low speed clock that detects abnormalities in the main oscillation circuit 30. As a specific example, in the present exemplary embodiment, the oscillation frequency is set at 1/16 that of main oscillation circuit 30, namely at 1/16 MHz.

The counter 32 counts the high speed clock input from the main oscillation circuit 30 in response to a signal inputted to RESET from the rise detection circuit 34 (referred to below as a reset signal), and outputs count values to the register 36 and the comparator 42. As a specific example, in the present exemplary embodiment the output value of the counter 32 is configured in hexadecimal (HEX).

The rise detection circuit 34 has a function of sampling and detecting rises of the low speed clock of the sub oscillation circuit 50 using the high speed clock of the main oscillation circuit 30. The register 36 has a function of acquiring and outputting to the comparator 38 the output of the counter 32, using falls of the signal input from the rise detection circuit 34 as a clock. As a specific example, in the present exemplary embodiment, the register 36 is configured by 8-bits (hexadecimal: HEX).

The lower limit value register 40 is pre-stored with a lower limit value at which the output value of the register 36 is considered normal. The comparator 38 compares the output value of the register 36 against the lower limit value stored in the lower limit value register 40. When the output value of the register 36 is smaller than the lower limit value, the comparator 38 outputs a signal expressed by "1" as NG (abnormal) to the OR circuit 26.

The upper limit value register 44 is pre-stored with an upper limit value at which the output value of the counter 32 is considered normal. The comparator 42 compares the output value of the counter 32 against the upper limit value stored in the upper limit value register 44. When the output value of the counter 32 is higher than the upper limit value, the comparator 42 outputs a signal expressed by "1" as NG (abnormal) to the OR circuit 26.

The frequency divider 52 has a function of generating a frequency divided clock by frequency-dividing the high speed clock output from the main oscillation circuit 30, and outputting this frequency divided clock to the shift register 54. As a specific example, in the present exemplary embodiment, the frequency divider 52 frequency-divides the high speed clock output from the main oscillation circuit 30 by 1/32.

The shift register 54 has a function of acquiring the frequency divided clock output from the frequency divider 52 and outputting to the oscillation verification circuit 56, according to the low speed clock output from the sub oscillation circuit 50. As a specific example, in the present exemplary embodiment, the shift register 54 is configured by 4-bits (BIN).

The oscillation verification circuit 56 outputs to the OR circuit 26 a signal expressed by "1" as NG (abnormal) when the output value of the shift register 54 has reached a specific value. As a specific example, in the present exemplary embodiment, the oscillation verification circuit 56 outputs at NG (abnormal) when the 4-bit output values of the shift register 54 are all the same value, namely "1111" or "0000".

The OR circuit 26 is input with signals output from the comparator 38, the comparator 42, and the oscillation verification circuit 56. In the present exemplary embodiment, an "H" level abnormality detection signal is output from the OR circuit 26 when any one of the comparator 38, the comparator 42 and the oscillation verification circuit 56 has detected NG (abnormal). Further, an "L" level abnormality detection signal is output when all of the comparator 38, the comparator 42 and the oscillation verification circuit 56 have detected OK (normal).

Explanation follows regarding operation of the oscillation circuit 20 of the present exemplary embodiment with reference to the drawings.

Figure 3:
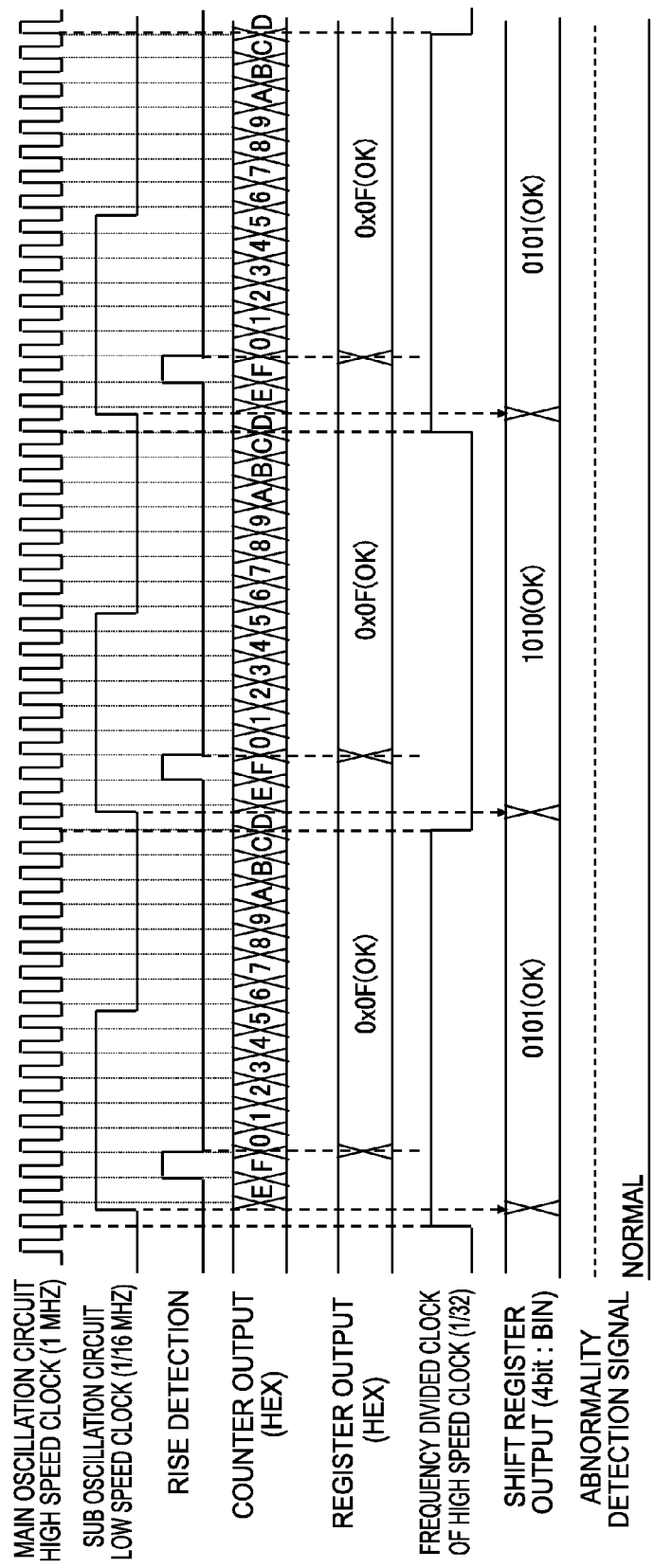
FIG. 3 is an example of a timing chart during normal operation of a main oscillation circuit and a sub oscillation circuit of the present exemplary embodiment.

Firstly, explanation is given regarding normal operation of the main oscillation circuit 30 and the sub oscillation circuit 50. FIG. 3 shows an example of a timing chart during normal operation of the main oscillation circuit 30 and the sub oscillation circuit 50.

A rise of the low speed clock of the sub oscillation circuit 50 is detected by sampling with the high speed clock of the main oscillation circuit 30.

Following detection of a rise of the sub oscillation circuit 50, the rise detection circuit 34 outputs a signal at "H" level for a single clock interval of the high speed clock, and then outputs a signal at "L" level until the next rise of the sub oscillation circuit 50 is detected. Since in the present exemplary embodiment the sub oscillation circuit 50 has a frequency of 1/16 that of the main oscillation circuit 30, the output signal of the rise detection circuit 34 rises (or falls) at every sixteenth clock cycle of the high speed clock.

The counter 32 counts the high speed clock for the period from one fall of the output signal of the rise detection circuit 34 until the next fall thereof, and outputs the count value to the comparator 42. As shown in FIG. 3, in the present exemplary embodiment, the counter 32 counts from 0 to F (15), and outputs a count value of "F (15)".

In the comparator 42, the count value of the counter 32 ("F (15)") is compared against the upper limit value stored in the upper limit value register 44 (for example 16). Since the count value is lower than the upper limit value, a signal expressed by "0" indicating normal (OK) is output to the OR circuit 26.

Similarly to the counter 32, the register 36 also stores the output from the counter 32 for a period from one fall of the output signal of the rise detection circuit 34 until the next fall thereof, and outputs the output from the counter 32 to the comparator 38. As shown in FIG. 3, in the present exemplary embodiment "0×0 F (15)" is output. Accordingly, the value expressed by the signals input to the comparator 38 and the comparator 42 are common values ("15" in the present exemplary embodiment) when the main oscillation circuit 30 and the sub oscillation circuit 50 are operating normally.

In the comparator 38, the output value from the register 36 ("0×0 F (15)") is compared against the lower limit value stored in the comparator 38 (for example 14). Since the output value is higher than the lower limit value, a signal expressed by "0" indicating normal (OK) is output to the OR circuit 26.

The shift register 54 of the second abnormality detection section 24 acquires the frequency divided clock output from the frequency divider 52 at a timing of the rise of the low speed clock output from the sub oscillation circuit 50, and stores "1" or "0" according to the level of the frequency divided clock. As shown in FIG. 3, in the present exemplary embodiment "1" and "0" are stored alternately in the shift register 54.

The oscillation verification circuit 56 outputs a signal expressing normality or abnormality to the OR circuit 26 according to the value of each bit of the 4-bit output signal output from the shift register 54. As shown in FIG. 3, since "1" and "0" are stored alternately in the shift register 54, the values of each of the bits of the output signal are not all the same value when the main oscillation circuit 30 and the sub oscillation circuit 50 are operating normally. Accordingly, the oscillation verification circuit 56 outputs a signal expressed by "0" indicating normal (OK) to the OR circuit 26.

An "L" level abnormality detection signal indicating normal is output from the OR circuit 26 since each of the signals input is expressed by "0".

Figure 4:
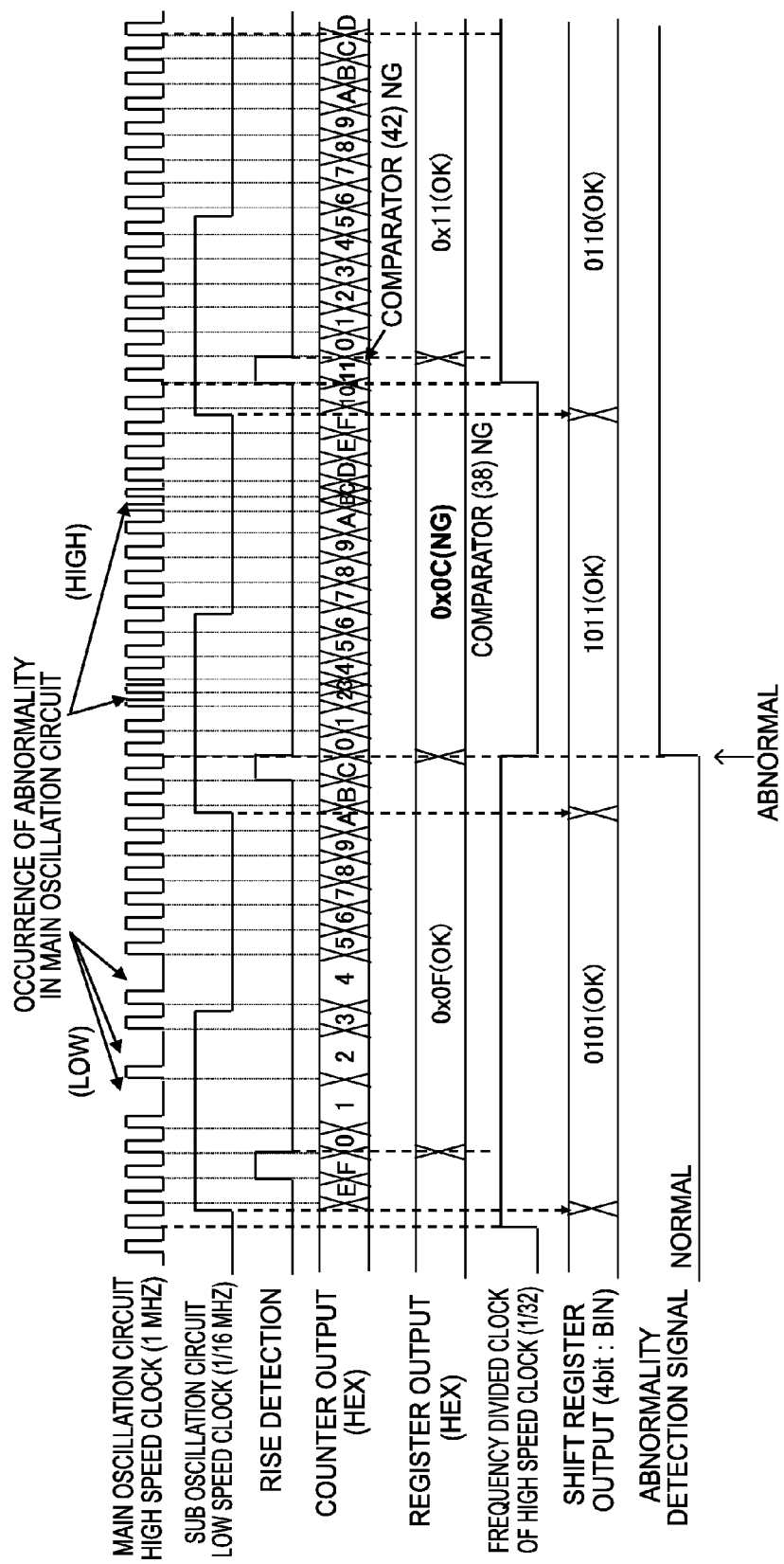
FIG. 4 is an example of a timing chart during operation with abnormal oscillation in a main oscillation circuit of the present exemplary embodiment.

Next, explanation follows regarding a case in which abnormal oscillation has occurred in the main oscillation circuit 30. FIG. 4 shows an example of a timing chart of operation when there is abnormal oscillation in the main oscillation circuit 30.

As shown in FIG. 4, when abnormal oscillation, in which the frequency of the main oscillation circuit 30 drops, occurs, a reset signal is input from the rise detection circuit 34 whilst the count value of the counter 32 is still smaller than that during normal operation. In FIG. 4, since only 13 clock cycles occur in the period in which there should be 16 clock cycles of the high speed clock during normal operation, the counter 32 accordingly outputs "C (12)" as the count value. This count value=12 is input to the comparator 42, however, since it is the upper limit value stored in the upper limit value register 44 or below, the comparator 42 does not treat it as abnormal (NG), and outputs a signal expressed by "0" as normal (OK) to the OR circuit 26.

On the other hand, the count value of the counter 32 is also input to the register 36. As shown in FIG. 4, since only 13 clock cycles' worth have been counted the register 36 outputs "0×0 C (12)". In the comparator 38, the output value ("0×0 C (12)") of the register 36 is compared against the lower limit value stored in the comparator 38. Since the output value is lower than the lower limit value, the comparator 38 outputs an abnormal signal expressed by "1" to the OR circuit 26.

Note that when this occurs, as shown in FIG. 4, in the second abnormality detection section 24, although "1" and "0" are not stored alternately in the shift register 54, the 4 bit values are not all the same. Accordingly, the oscillation verification circuit 56 outputs a signal expressed by "0" as normal (OK) to the OR circuit 26.

Since out of the signals input from the comparator 38, the comparator 42 and the oscillation verification circuit 56, the signal input from the comparator 38 is expressed by "1", an "H" level abnormality detection signal is output from the OR circuit 26 indicating abnormality.

As shown in FIG. 4, when abnormal oscillation, in which the frequency of the main oscillation circuit 30 increases, occurs, the counter 32 continues to count even when the count value has exceeded the value in normal operation, and the count value increases. In FIG. 4, since 18 clock cycles then occur in the period in which there should be 16 clock cycles of the high speed clock in normal operation, the counter 32 outputs "11 (17)" as the count value. This count value=17 is input to the comparator 42. Since this count value is above the upper limit value stored in the upper limit value register 44 or above, the comparator 42 outputs a signal expressed by "1" as abnormal (NG) to the OR circuit 26.

On the other hand, the count value of the counter 32 is also input to the register 36. As shown in FIG. 4, as 18 clock cycles' worth have been counted, the register 36 outputs "0×11 (17)". In the comparator 38, the output value of the register 36 ("0×11 (17)") is compared against the lower limit value stored in the comparator 38. However since the output value of the register 36 is the lower limit value or above, a signal expressed by "0" as normal (OK) is output to the OR circuit 26.

Accordingly, when abnormal oscillation has occurred in the operation of the main oscillation circuit 30, the abnormality (NG) can be detected by the comparator 38 or the comparator 42 of the first abnormality detection section 22.

Figure 5:
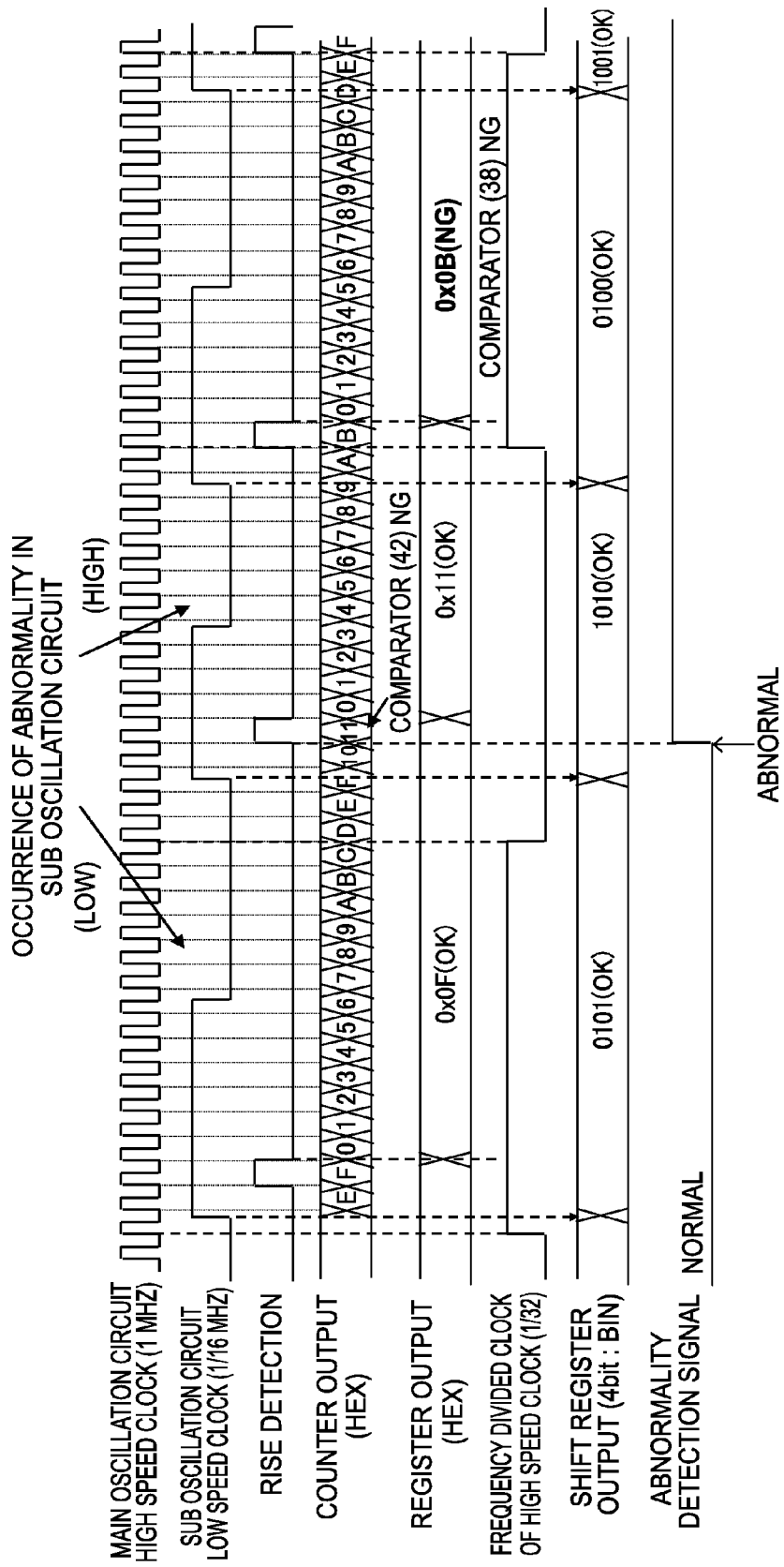
FIG. 5 is an example of a timing chart during operation with abnormal oscillation in a sub oscillation circuit of the present exemplary embodiment.

Next, explanation follows regarding a case in which abnormal oscillation has occurred in the sub oscillation circuit 50. FIG. 5 shows an example of a timing chart during operation when there is abnormal oscillation in the sub oscillation circuit 50.

As shown in FIG. 5, when abnormal oscillation, in which the frequency of the sub oscillation circuit 50 decreases, occurs, the timing at which the rise detection circuit 34 detects rises becomes later than in normal operation. Accordingly, the timings at which a reset signal is input to the counter 32 becomes later, the counter 32 continues to count even when the count value exceeds the value during normal operation, and the count value increases. In FIG. 5, the counter 32 outputs "11 (17)" as the count value. This count value=17 is input to the comparator 42. Since this count value is above the upper limit value stored in the upper limit value register 44 or above, the comparator 42 outputs a signal expressed by "1" indicating abnormal (NG) to the OR circuit 26.

On the other hand, the count value of the counter 32 is also input to the register 36. As shown in FIG. 5, the register 36 outputs "0×11 (17)". In the comparator 38, the output value ("0×11 (17)") of the register 36 is compared against the lower limit value stored in the comparator 38. Since it is the lower limit value or above, a signal expressed by "0" as normal (OK) is output to the OR circuit 26.

Note that when this occurs, as shown in FIG. 5, in the second abnormality detection section 24, although "1" and "0" are not stored alternately in the shift register 54, the oscillation verification circuit 56 outputs a signal expressed by "0" indicating normal (OK) to the OR circuit 26 since the four bit values are not all the same value.

As shown in FIG. 5, when abnormal oscillation, in which the frequency of the sub oscillation circuit 50 increases, occurs, a reset signal is input from the rise detection circuit 34 whilst the count value of the counter 32 is still smaller than in normal operation. In FIG. 5, since the reset signal is input when only 12 clock cycles of the high speed clock have occurred, the counter 32 outputs "B (11)" as the count value. This count value=11 is input to the comparator 42. Since it is the upper limit value stored in the upper limit value register 44 or below, the comparator 42 does not treat it as abnormal (NG), and outputs a signal expressed by "0" indicating normal (OK) to the OR circuit 26.

On the other hand, the count value of the counter 32 is also input to the register 36. Since only 12 clock cycles' worth have been counted, as shown in FIG. 5, the register 36 outputs "0×0 B (11)". In the comparator 38, the output value ("0×0 B (11)") of the register 36 is compared against the lower limit value stored in the comparator 38, and since it is lower than the lower limit value, a signal expressed by "1" indicating abnormal (NG) is output to the OR circuit 26.

Accordingly, when abnormal oscillation has occurred in the operation of the sub oscillation circuit 50, the abnormality (NG) can be detected by the comparator 38 and the comparator 42 of the first abnormality detection section 22.

Figure 6:
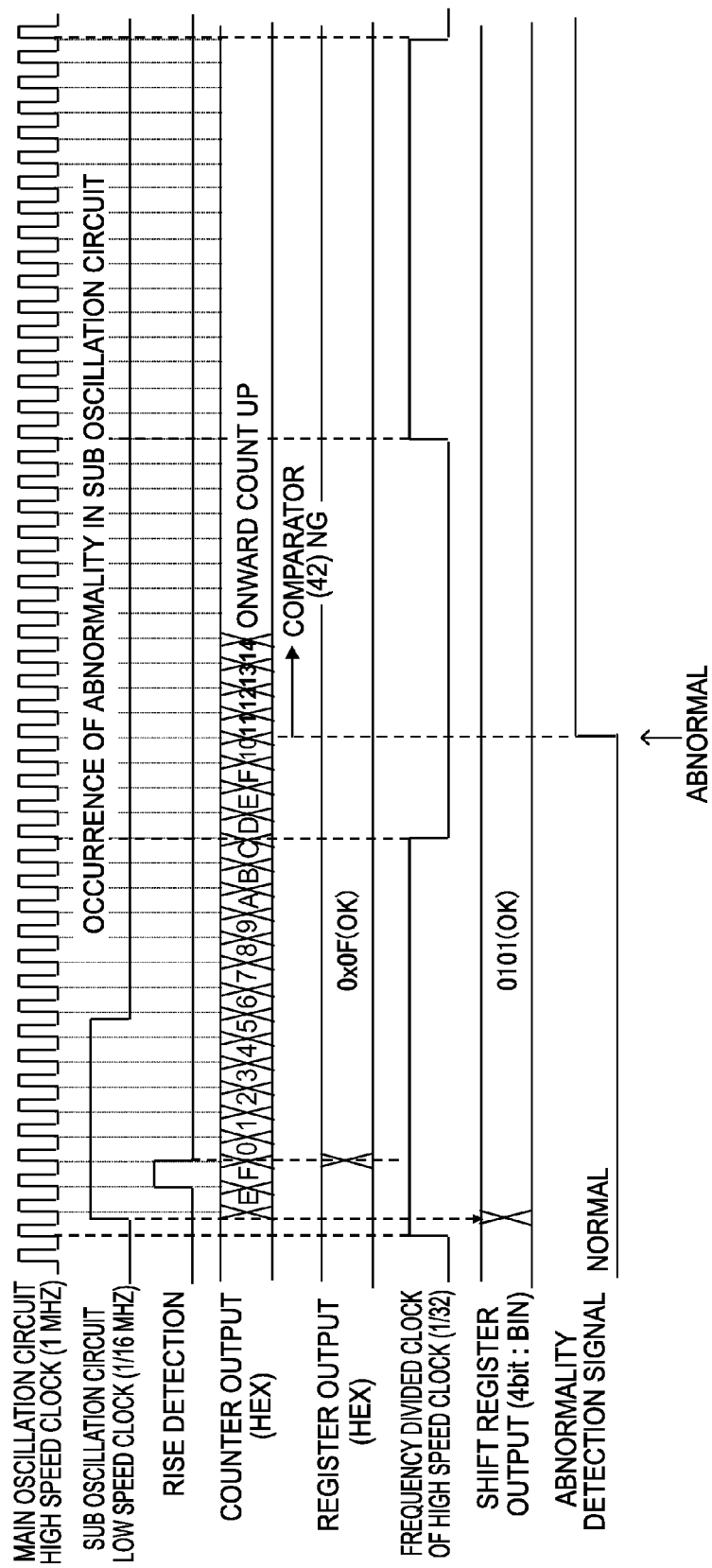
FIG. 6 is an example of a timing chart during operation in which oscillation has stopped in a sub oscillation circuit of the present exemplary embodiment.

Next, explanation follows regarding a case in which oscillation cessation has occurred in the sub oscillation circuit 50. FIG. 6 shows an example of a timing chart during operation in which oscillation has stopped in the sub oscillation circuit 50.

As shown in FIG. 6, when oscillation stops in the sub oscillation circuit 50, no rise is detected by the rise detection circuit 34 from oscillation cessation onwards. Accordingly, reset signals are not input to the counter 32, and the counter 32 continues to count up. Since the count value of this continued count is input to the comparator 42, the comparator 42 outputs a signal expressed by "1" indicating abnormal (NG) to the OR circuit 26 when the count value is the upper limit value stored in the upper limit value register 44 or above.

Likewise, no signals are input to the register 36 from the rise detection circuit 34 from oscillation cessation in the sub oscillation circuit 50 onwards. Accordingly, a state is reached wherein "0×0 F (15)" is output from the register 36 based on the signal input to the register 36 immediately before (immediately prior to oscillation cessation of the sub oscillation circuit 50: during normal operation). Since this is the lower limit value stored in the lower limit value register 40 or above, the comparator 38 accordingly outputs signal expressed by "0" indicating normal (OK) to the OR circuit 26.

Moreover, no signals are input from the sub oscillation circuit 50 to the shift register 54 from oscillation cessation in the sub oscillation circuit 50 onwards. Accordingly, a state is reached wherein "0101" is output from the shift register 54 based on the low speed clock input to the shift register 54 immediately before (immediately prior to oscillation cessation in the sub oscillation circuit 50: during normal operation). The oscillation verification circuit 56 accordingly outputs a signal expressed by "0" indicating normal (OK) to the OR circuit 26.

In this way, abnormality (NG) can be detected by the comparator 42 of the first abnormality detection section 22 when oscillation cessation has occurred in the sub oscillation circuit 50.

Figure 7:
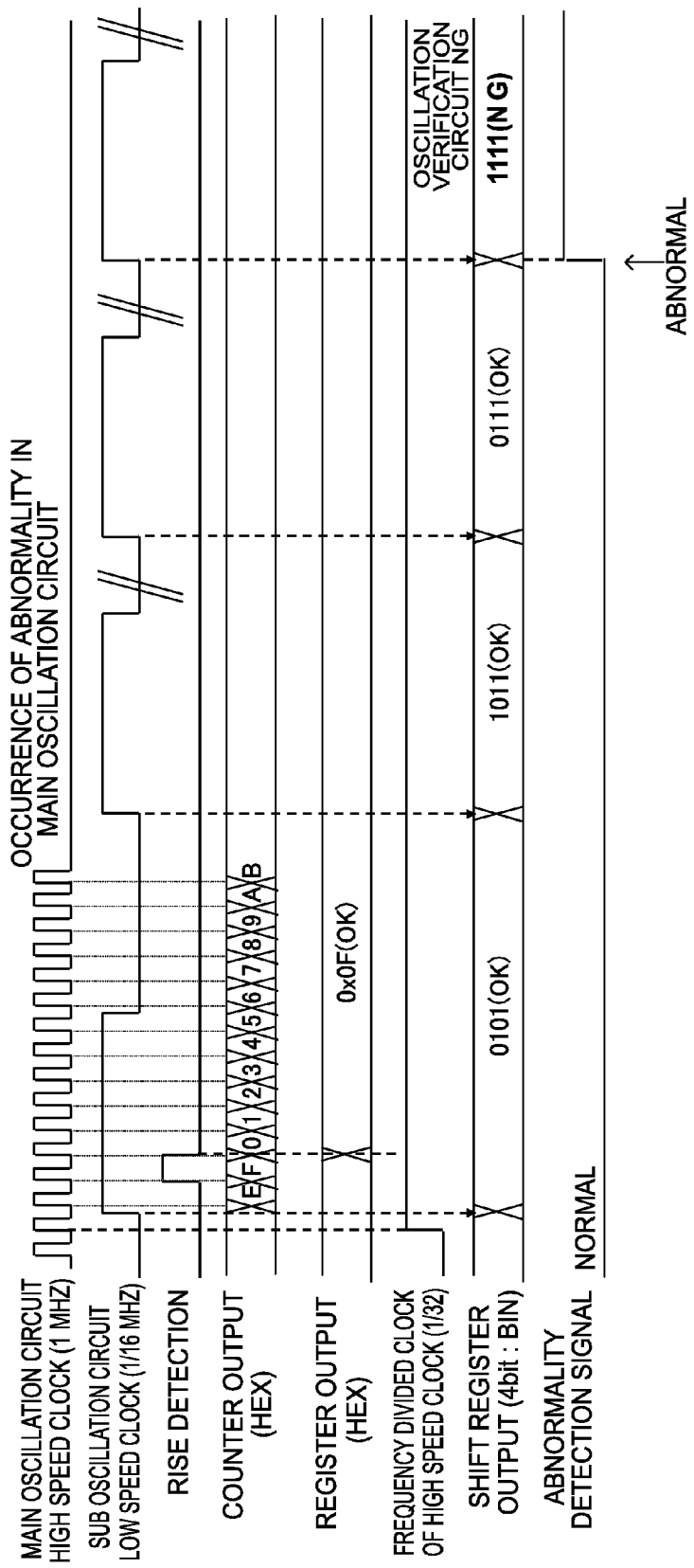
FIG. 7 is an example of a timing chart during operation in which oscillation has stopped in a main oscillation circuit of the present exemplary embodiment.

Next, explanation follows regarding a case in which oscillation cessation has occurred in the main oscillation circuit 30. FIG. 7 shows an example of a timing chart of operation in which oscillation has stopped in the main oscillation circuit 30.

As shown in FIG. 7, when oscillation cessation occurs in the main oscillation circuit 30, no rise is detected in the rise detection circuit 34 from oscillation cessation onwards. Reset signals are therefore not input to the counter 32. However, count up also stops since the high speed clock is not input. In the example shown in FIG. 7, the output count value then continues to be output at "B (11)". Since this value is the upper limit value stored in the upper limit value register 44 or below, the comparator 42 outputs a signal expressed by "0" indicating normal (OK) to the OR circuit 26.

However, there is also no signal input from the rise detection circuit 34 from oscillation cessation in the main oscillation circuit 30 onwards. The register 36 accordingly reaches a state in which "0×0 F (15)" is output based on the signal input to the register 36 immediately before (immediately prior to oscillation cessation of the main oscillation circuit 30: during normal operation). The comparator 38 accordingly outputs a signal expressed by "0" indicating normal (OK) to the OR circuit 26 since this is the lower limit value stored in the lower limit value register 40 or above.

Moreover, since the high speed clock is not input anew to the frequency divider 52 from oscillation cessation in the main oscillation circuit 30 onwards, in the example shown in FIG. 7, the frequency divider 52 continues to output an "H" level frequency divided clock. The shift register 54 continuous to store the same value ("1") since the shift register 54 obtains the "H" level frequency divided clock at a timing of rises in the low speed clock of the sub oscillation circuit 50. The oscillation verification circuit 56 outputs a signal expressed by "1" indicating abnormal (NG) to the OR circuit 26 when the output value of the shift register 54 becomes "1111".

Thus, abnormality can be detected by the oscillation verification circuit 56 of the second abnormality detection section 24 when oscillation cessation occurs in the main oscillation circuit 30.

FIG. 8 summarizes the relationships of abnormalities in the main oscillation circuit 30 and the sub oscillation circuit 50 and the detections of the comparator 38, the comparator 42 and the oscillation verification circuit 56.

As explained above, in the oscillation circuit 20 of the present exemplary embodiment, the internal circuit 12 is equipped with the main oscillation circuit 30 that supplies the high speed clock and the sub oscillation circuit 50, and is also equipped with the first abnormality detection section 22 and the second abnormality detection section 24 that detect abnormality in these circuits. The lower limit value is pre-stored in the lower limit value register 40 for the number of clock cycles considered normal for the high speed clock output from the main oscillation circuit 30 in a predetermined period corresponding to the oscillation frequency of the sub oscillation circuit 50, and the upper limit value of the same is pre-stored in the upper limit value register 44. In the first abnormality detection section 22, the counter 32 counts the number of clock cycles of the high speed clock in a period corresponding to the high speed clock and the low speed clock, and the count value is compared against the upper limit value stored in the upper limit value register 44 in the comparator 42. When the count value exceeds the upper limit value, a signal indicating abnormality (NG) is output from the comparator 42. The output value from the register 36 that corresponds to the count value of the counter 32 is compared against the lower limit value stored in the lower limit value register 40 in the comparator 38, a signal indicating abnormality (NG) is output from the comparator 38 and when the output value is lower than the lower limit value.

In the second abnormality detection section 24, the shift register 54 obtains the frequency divided clock of the high speed clock that has been frequency-divided by the frequency divider 52 at a timing corresponding to the low speed clock. A signal indicating abnormality (NG) is output from the oscillation verification circuit 56 when each bit of the output value of the shift register 54 is the same value.

Accordingly, abnormalities relating to abnormal oscillation in the main oscillation circuit 30 and the sub oscillation circuit 50, and relating to oscillation cessation in the sub oscillation circuit 50, can be detected by the first abnormality detection section 22. Moreover, abnormalities relating to oscillation cessation in the main oscillation circuit 30 can be detected by the second abnormality detection section 24.

Therefore, abnormality detection is possible even when the sub oscillation circuit 50 has stopped, and since it is not necessary to provide a new oscillation circuit for detecting abnormalities in the sub oscillation circuit 50, a reduction in size can be achieved for the oscillation circuit 20 whilst still maintaining high reliability.

Note that there are no particularly limitations to the integrated circuit 10 provided with the oscillation circuit 20 with a function to detect abnormalities within itself. For example, an example has been given that is preferably applied to an integrated circuit 10 that is employed in a monitoring system for monitoring a vehicle installed battery. In the integrated circuit 10 employed in such a battery monitoring system, if abnormal oscillation occurs in an oscillation circuit during battery discharge, battery discharge may not stop and the battery may go flat. The oscillation circuit of the present invention is hence preferably applied in order to detect abnormalities in the oscillation circuit with good precision.

Note that in the present exemplary embodiment, the main oscillation circuit 30 is configured as a high speed oscillation circuit, and the sub oscillation circuit 50 is configured as a low speed oscillation circuit with a frequency of 1/16 that of the main oscillation circuit 30, however the ratio therebetween is not limited thereto. Note that the precision with which abnormalities are detected increases as the ratio is made higher. Moreover, in the present exemplary embodiment, the lower limit value stored in the lower limit value register 40 and the upper limit value stored in the upper limit value register 44 are merely examples, and are not limitations to the present exemplary embodiment. These values may be set according to such factors as the precision required for abnormality detection. The bit count of the register 36 and the shift register 54 and the division ratio of the frequency divider 52, for example, are also not limited to the present exemplary embodiment, and may be set according to such factors as the precision required for abnormality detection.

The main oscillation circuit 30 is configured as a high speed oscillation circuit and the sub oscillation circuit 50 is configured as a low speed oscillation circuit. However, these two circuits may be configured with the same frequency, or the main oscillation circuit 30 may be configured as a low speed oscillation circuit and the sub oscillation circuit 50 configured as a high speed oscillation circuit. In such cases, configuration is made such that the frequency divider 52 is input with the clock output from the sub oscillation circuit 50 rather than with the clock output from the main oscillation circuit 30. Note that since current consumption increases when the sub oscillation circuit 50 is configured as a high speed oscillation circuit, such a configuration is not desirable from the perspective of suppressing electricity consumption.

There is also no limitation to the configuration of the present exemplary embodiment wherein an abnormality detection signal indicating abnormality is output from the OR circuit 26 when abnormality is indicated according to the output of any one of the comparator 38, the comparator 42 or the oscillation verification circuit 56. For example, configuration may be made wherein output signals from each of the comparator 38, the comparator 42 and the oscillation verification circuit 56 are output to outside the oscillation circuit 20 (for example to the internal circuit operation controller 14) without passing through the OR circuit 26.

Moreover, in the present exemplary embodiment, rises of the low speed clock of the sub oscillation circuit 50 are detected employing the rise detection circuit 34, however a similar function can be achieved employing a circuit that detects falls.

The configuration and operation of the integrated circuit 10, the oscillation circuit 20 etc. in the exemplary embodiment explained above are merely examples thereof, and obviously modifications are possible according to circumstances within a range not departing from the spirit of the present invention as circumstances require. For example, the lower limit value register 40 and the upper limit value register 44 may be configured by memory, rather than by registers.

What is claimed is:

1. An oscillation circuit for use with an internal circuit of an IC (Integrated Circuit), comprising:
   a main oscillation circuit that outputs a predetermined main clock signal to the internal circuit;
   a sub oscillation circuit that outputs a sub clock signal having a frequency that is different from a frequency of the main oscillation circuit;
   a first abnormality detection section that detects a first abnormality according to a number of main clock signal cycles output from the main oscillation circuit within a predetermined period corresponding to the sub clock signal output from the sub oscillation circuit; and
   a second abnormality detection section that detects a second abnormality according to a frequency divided clock signal of the main clock signal output from the main oscillation circuit that has been frequency-divided and the sub clock signal output from the sub oscillation circuit, based on whether or not the frequency divided clock signal is unchanged in a predetermined period; and
   an OR circuit that receives input signals generated by the first and second abnormality detection sections and that outputs an abnormality detection signal when either the first abnormality detection section detects the first abnormality or the second abnormality detection section detects the second abnormality, the OR circuit outputting a normal detection signal when neither the first abnormality detection section detects the first abnormality nor the second abnormality detection sections detects the second abnormality,
   wherein the first abnormality detection section comprises a pair of comparators, and wherein the OR circuit receives input signals generated by both of the comparators.

2. The oscillation circuit of claim 1, wherein the first abnormality detection section detects as the first abnormality each of an abnormality in the frequency of the main oscillation circuit, an abnormality in the frequency of the sub oscillation circuit, and an oscillation cessation of the sub oscillation circuit.

3. The oscillation circuit of claim 1, wherein the second abnormality detection section detects an oscillation cessation of the main oscillation circuit as the second abnormality.

4. The oscillation circuit of claim 1, wherein the second abnormality detection section detects the second abnormality based on levels of the frequency divided clock signal at timings corresponding to outputs of the sub clock signal from the sub oscillation circuit.

5. An integrated circuit comprising:
   the oscillation circuit of claim 1 having a function to detect abnormalities in itself;
   and the internal circuit, the internal circuit operating according to the main clock signal output from the main oscillation circuit of the oscillation circuit.

6. The oscillation circuit of claim 1, wherein:
   the first abnormality detection section comprises a storage section that stores an upper limit value and a lower limit value for the number of cycles of the main clock signal;
   the first abnormality detection section is configured to acquire the number of cycles of the main clock signal output from the main oscillation circuit within a predetermined period corresponding to the sub clock signal output from the sub oscillation circuit and to compare the acquired number of main clock signal cycles against the upper limit value pre-stored in the storage section, and to detect the first abnormality if the number of clock cycles of the main clock signal exceeds the upper limit value; and
   the second abnormality detection section is configured to store a level of the frequency divided clock signal of the main clock signal output from the main oscillation circuit that has been divided at timings corresponding to the sub clock signal output from the sub oscillation circuit, and to detect, as second abnormality, a cessation of oscillation in the main oscillation circuit if the stored level of the frequency divided clock signal is at a same level a predetermined successive number of times.

7. A method of detecting an abnormality in an oscillation circuit including a main oscillation circuit that outputs a predetermined main clock signal to an internal circuit and a sub oscillation circuit that outputs a sub clock signal having a frequency that is different from the frequency of the main oscillation circuit, the method comprising:
   storing a level of a frequency-divided clock signal of the main clock signal output from the main oscillation circuit that has been divided at timings corresponding to the sub clock signal output from the sub oscillation circuit;

detecting, as a first abnormality, a cessation of oscillation in the main oscillation circuit if the stored level of the frequency divided clock signal is at a same level a predetermined successive number of times, and generating a first abnormality detection result signal;

acquiring a number of cycles of the main clock signal output from the main oscillation circuit within a predetermined period corresponding to the sub clock signal output from the sub oscillation circuit;

comparing the acquired number of main clock signal cycles against an upper limit value pre-stored in a storage section, and detecting a second abnormality and generating a second abnormality detection result signal if the number of cycles of the main clock signal exceeds the upper limit value;

comparing the acquired number of main clock signal cycles against a lower limit value pre-stored in another storage section, and detecting a third abnormality and generating a third abnormality detection result signal if the number of cycles of the main clock signal is smaller than the lower limit value; and supplying the first, second, and third abnormality detection result signals as input signals to an OR circuit, the OR circuit outputting an abnormality detection signal if any of the first, second, and third abnormalities are detected and outputting a normal detection signal when none of the first, second, and third abnormalities has been detected.

* * * * *